United States Patent
Hung et al.

(10) Patent No.: US 10,103,262 B2
(45) Date of Patent: Oct. 16, 2018

(54) METHOD OF FORMING A FINFET STRUCTURE WITH HIGH QUALITY EPI FILM

(71) Applicant: TAIWAN SEMICONDUCTOR MANUFACTURING CO., LTD., Hsinchu (TW)

(72) Inventors: Shih-Wei Hung, Kaohsiung (TW); Chien-Feng Lin, Hsinchu County (TW); Chia-Chiung Lo, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/994,060

(22) Filed: Jan. 12, 2016

(65) Prior Publication Data

US 2017/0200825 A1 Jul. 13, 2017

(51) Int. Cl.
| | | |
|---|---|---|
| *H01L 21/336* | (2006.01) | |
| *H01L 29/78* | (2006.01) | |
| *H01L 21/02* | (2006.01) | |
| *H01L 21/3065* | (2006.01) | |
| *H01L 21/762* | (2006.01) | |
| *H01L 29/04* | (2006.01) | |
| *H01L 29/66* | (2006.01) | |

(52) U.S. Cl.
CPC .... *H01L 29/7848* (2013.01); *H01L 21/02057* (2013.01); *H01L 21/02532* (2013.01); *H01L 21/3065* (2013.01); *H01L 21/76224* (2013.01); *H01L 29/045* (2013.01); *H01L 29/66795* (2013.01)

(58) Field of Classification Search
CPC ......... H01L 29/41791; H01L 29/66636; H01L 29/66818; H01L 29/7848; H01L 29/785; H01L 21/823431; H01L 21/823821; H01L 21/845; H01L 27/121
See application file for complete search history.

(56) References Cited

U.S. PATENT DOCUMENTS

| | | | | |
|---|---|---|---|---|
| 5,358,890 A | * | 10/1994 | Sivan | H01L 21/76216 257/E21.258 |
| 6,596,597 B2 | * | 7/2003 | Furukawa | H01L 21/2807 257/E21.201 |
| 2002/0187610 A1 | * | 12/2002 | Furukawa | H01L 21/2807 438/283 |
| 2003/0201500 A1 | * | 10/2003 | Furukawa | H01L 21/2807 257/368 |
| 2006/0249815 A1 | * | 11/2006 | Forbes | H01L 31/1808 257/616 |
| 2014/0252489 A1 | * | 9/2014 | Yu | H01L 29/66795 257/368 |
| 2015/0279973 A1 | * | 10/2015 | Akarvardar | H01L 29/1054 438/283 |

(Continued)

*Primary Examiner* — Telly Green
(74) *Attorney, Agent, or Firm* — Maschoff Brennan

(57) ABSTRACT

A method of forming a semiconductor structure includes the following operations: (i) forming a feature comprising germanium over a substrate; (ii) removing a portion of the feature such that an interior portion of the feature is exposed; (iii) exposing a surface of the exposed interior portion to a surrounding containing oxygen; and (iv) treating the germanium oxide on the surface of the exposed interior portion with a liquid containing water.

20 Claims, 12 Drawing Sheets

(56) References Cited

U.S. PATENT DOCUMENTS

2016/0086796 A1\* 3/2016 Chan .................... H01L 21/365
                                                                     257/347
2016/0240681 A1\* 8/2016 Ching ................. H01L 29/7856
2016/0343806 A1\* 11/2016 Siddiqui ............... H01L 29/161

\* cited by examiner

METHOD OF FORMING A FINFET STRUCTURE WITH HIGH QUALITY EPI FILM

BACKGROUND

The semiconductor integrated circuit (IC) industry has experienced rapid growth. Technological progress in IC manufacture has produced several generations of ICs, and each generation fabricates smaller and more complex circuits than the previous generation. Currently, the semiconductor industry has progressed into nanometer technology nodes for higher device density and better electrical performance, and a variety of challenges from fabrication and design have led semiconductor technologies to three-dimensional designs, such as fin-like field effect transistors (finFETs). A typical FinFET is fabricated with a thin "fin" extending on a substrate. The channel of the FinFET is formed in the fin. In addition, a gate is formed to traverse the fin, and therefore a tri-gate structure is fabricated. It is beneficial to have a gate on three sides of the channel that allows the gate to control the channel from several sides. Although a number of finFETs and methods of fabricating finFETs have been proposed, they have not been satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
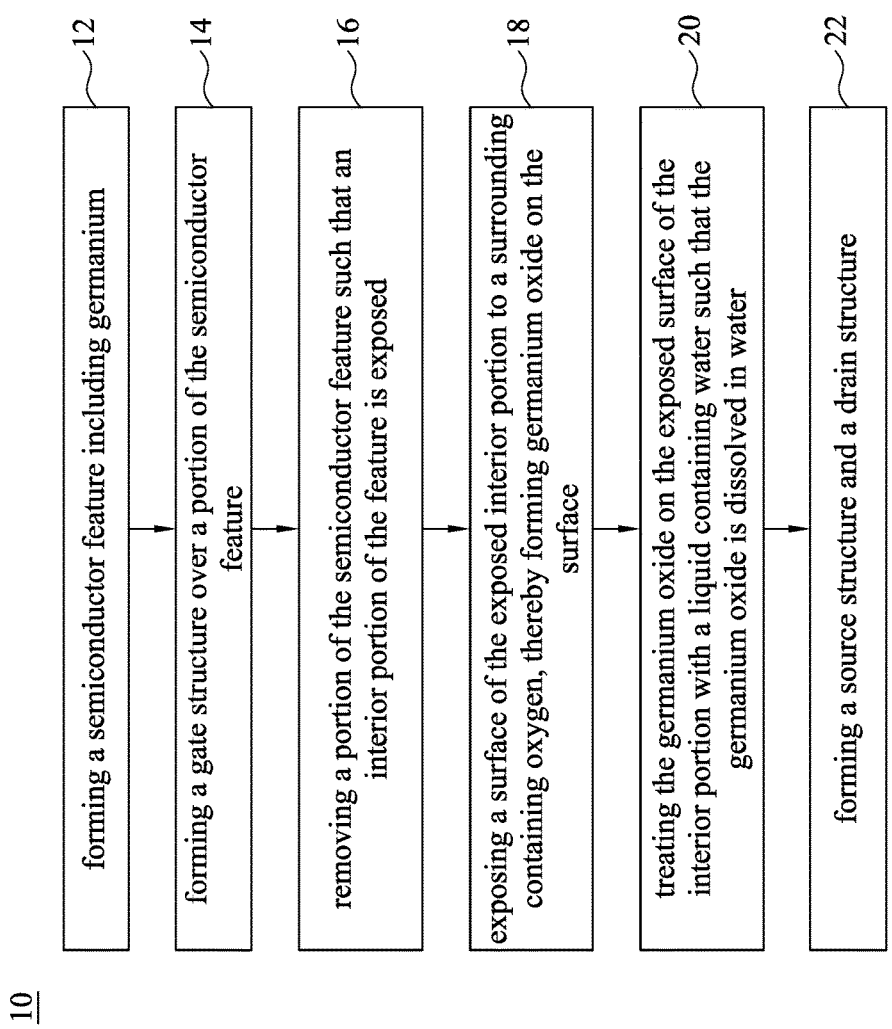
FIG. 1 is a flow chart illustrating a method of forming a semiconductor structure according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The semiconductor industry has continually reduced the size of components within the integrated circuit. Several advanced techniques have been developed to implement technique nodes with smaller feature sizes. Research and development have explored new materials and structure for better device performance including higher carrier mobility and better quality of interface between features. However, semiconductor features including germanium have not been entirely satisfactory in all aspects. For example, the surface of the semiconductor features including germanium still has some process issues.

The present disclosure relates generally to a method for forming a semiconductor structure including germanium. According to various embodiments of the present disclosure, the method disclosed herein is effective to treat the surface including germanium of the semiconductor features. Furthermore, the method provides advantages of high throughout, cost effective operations, nontoxic characteristics, saving thermal budget, and damage-free to other features.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a flowchart illustrating a method 10 of forming a semiconductor structure according to various embodiments of the present disclosure. The semiconductor structure, for example, may be a finFET structure. As illustrated in FIG. 1, the method 10 includes operations 12, 14, 16, 18, 20 and 22. FIGS. 2-12 are various diagrams, in portion or entirety, at various stages of fabrication according to the method 10. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated operations and/or acts can be further divided into sub-operations and/or sub-acts in some implementations, while in other implementations some of the illustrated acts can be carried out concurrently with one another.

Figure 2:
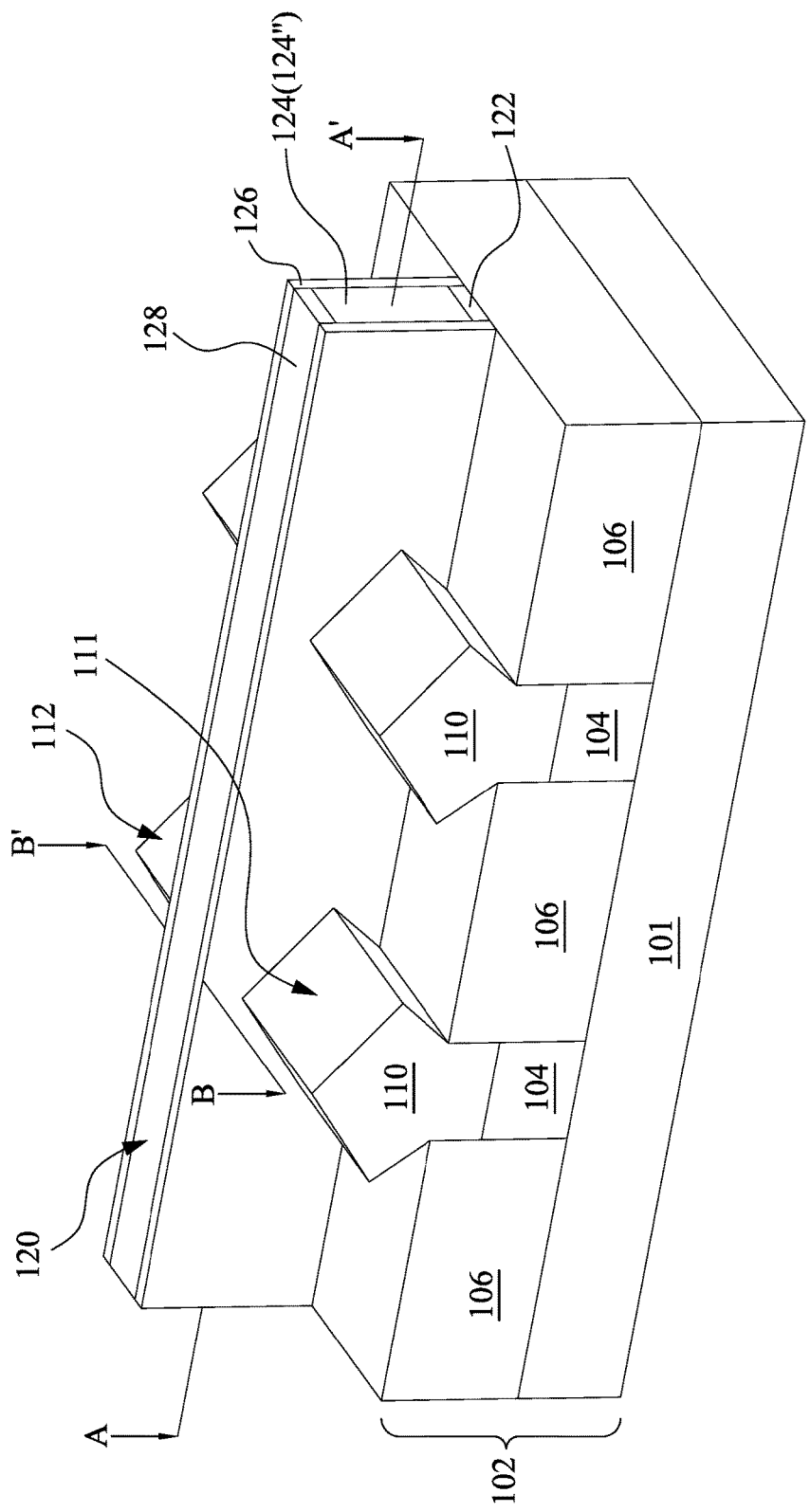
FIGS. 2-12 are various diagrams schematically illustrating the structures at various stages of the method according to various embodiments of the present disclosure.
Figure 3:
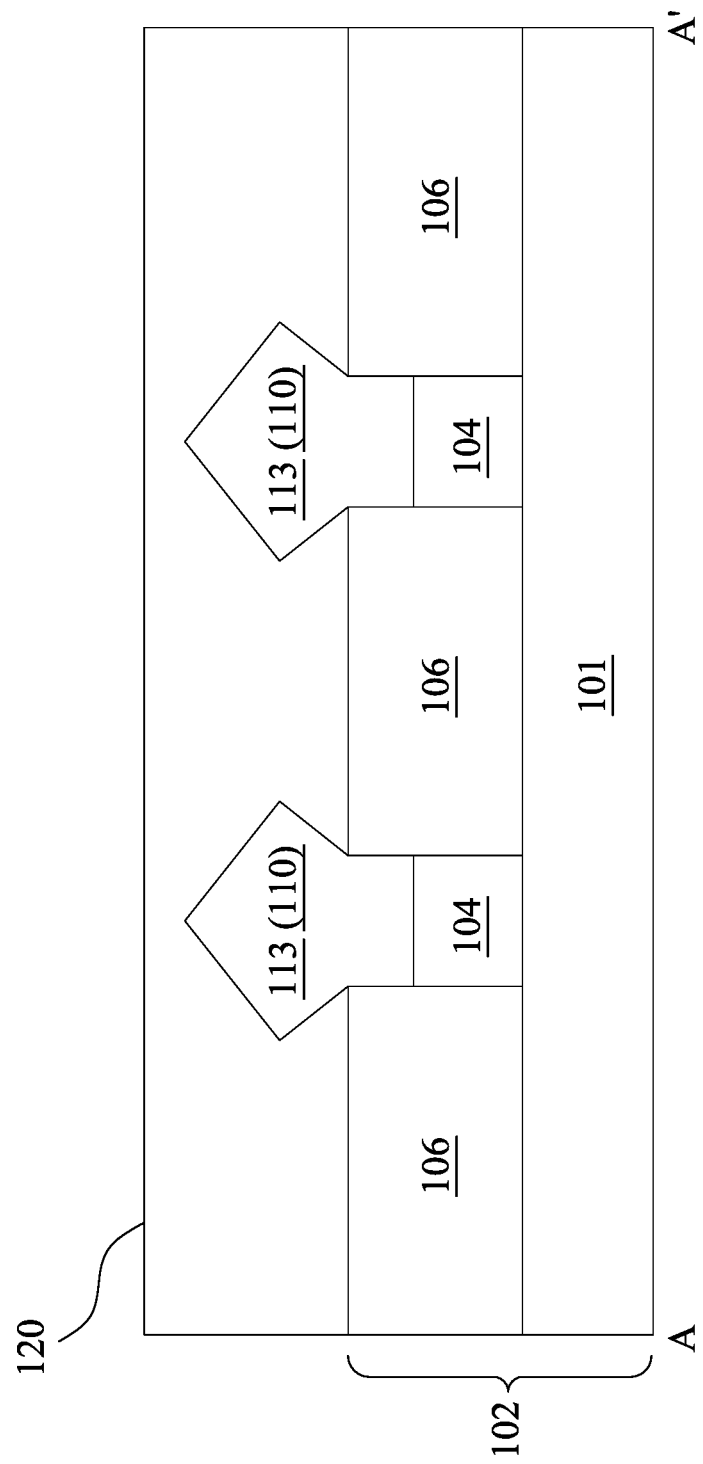

In the operation 12 of FIG. 1, a semiconductor feature including germanium is formed over a substrate. FIG. 2 is a perspective view schematically illustrating the structure formed in the operation 12 and operation 14. FIG. 3 is a diagrammatic cross-sectional view taken along line AA' in FIG. 2, and FIG. 4 is a diagrammatic cross-sectional view taken along line BB' in FIG. 2.

Figure 4:
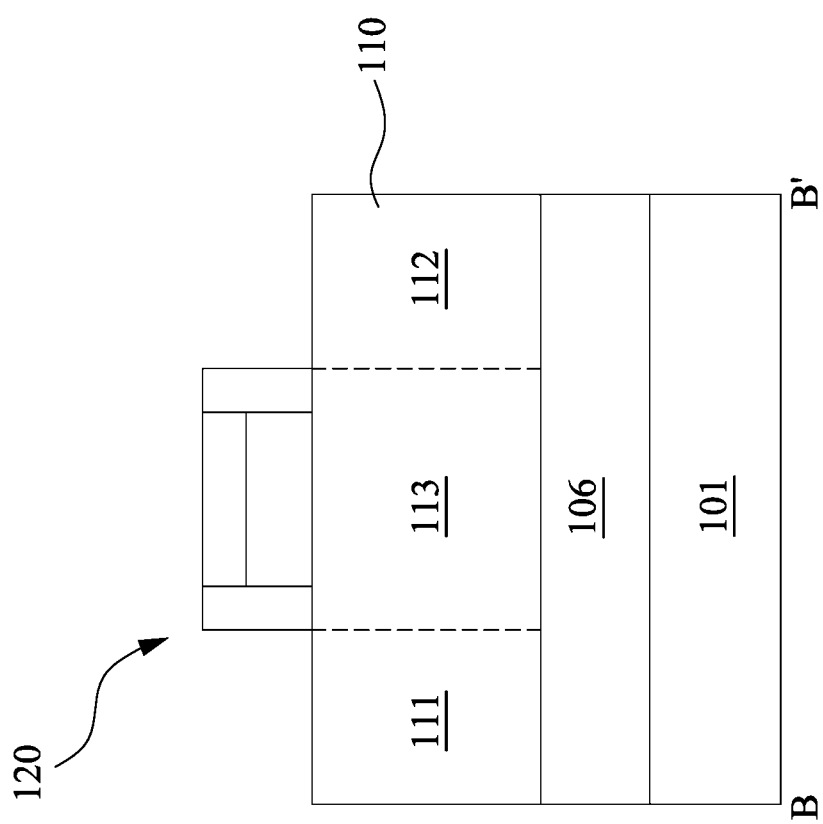

As shown in FIGS. 2-4, a semiconductor feature 110 including germanium is formed over a substrate 102. In various embodiments, the substrate 102 may include a semiconductor substrate 101. The semiconductor substrate 101, for example, may include silicon. In some embodiments, the semiconductor substrate 101 may include other elementary semiconductor such as for example germanium. In yet some embodiments, the semiconductor substrate 101 may include an alloy semiconductor such as for example silicon germanium, silicon germanium carbide, gallium indium phosphide and the like. In yet some embodiments, the semiconductor substrate 101 may include compound semiconductor such as for example gallium arsenic, silicon carbide, indium phosphide, indium arsenide and the like. In yet some embodiments, the semiconductor substrate 101 may include a semiconductor-on-insulator (SOI) structure. In yet some embodiments, the semiconductor substrate 101 may include an epitaxial layer overlying a bulk semiconductor material. Further, the semiconductor substrate 101 may include any suitable crystallographic orientation such as for example a (100), (111), or (110) crystallographic orientation. In examples, the semiconductor substrate 101 includes silicon with a top surface having a (100) crystalline orientation.

The semiconductor feature 110 extends from the substrate 102. The semiconductor feature 110, for example, may be a fin structure of a finFET. In various embodiments, the semiconductor feature 110 is in size of nanometer or micrometer scale. In some embodiments, the molar concentration of germanium in the semiconductor feature 110 is ranged from approximately 20% to approximately 80%. For example, the semiconductor feature 110 may include silicon germanium (SiGe), and the molar concentration of germanium in SiGe material is approximately 20-80%, specifically approximately 30-80%, more specifically 40-80%. In yet some embodiments, the semiconductor feature 110 may be made of germanium compound, germanium alloy, pure germanium, and/or combinations thereof.

Figure 5:
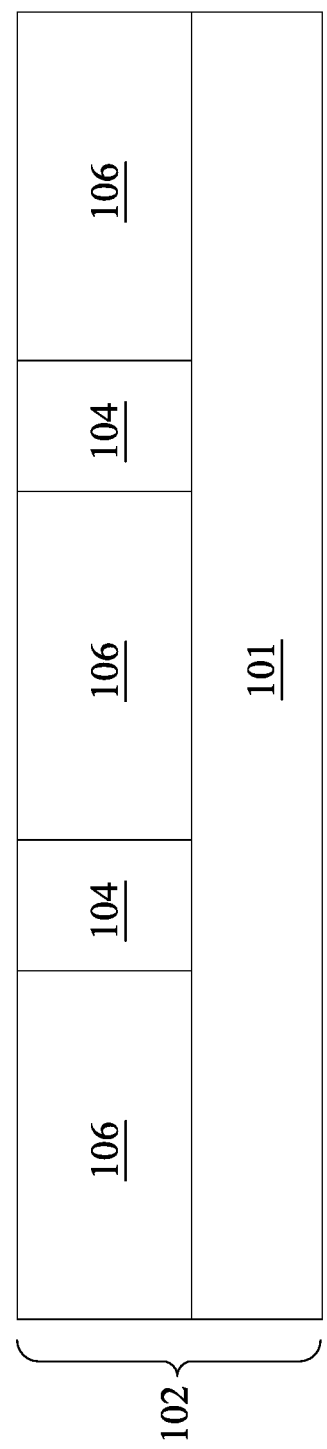
Figure 6:
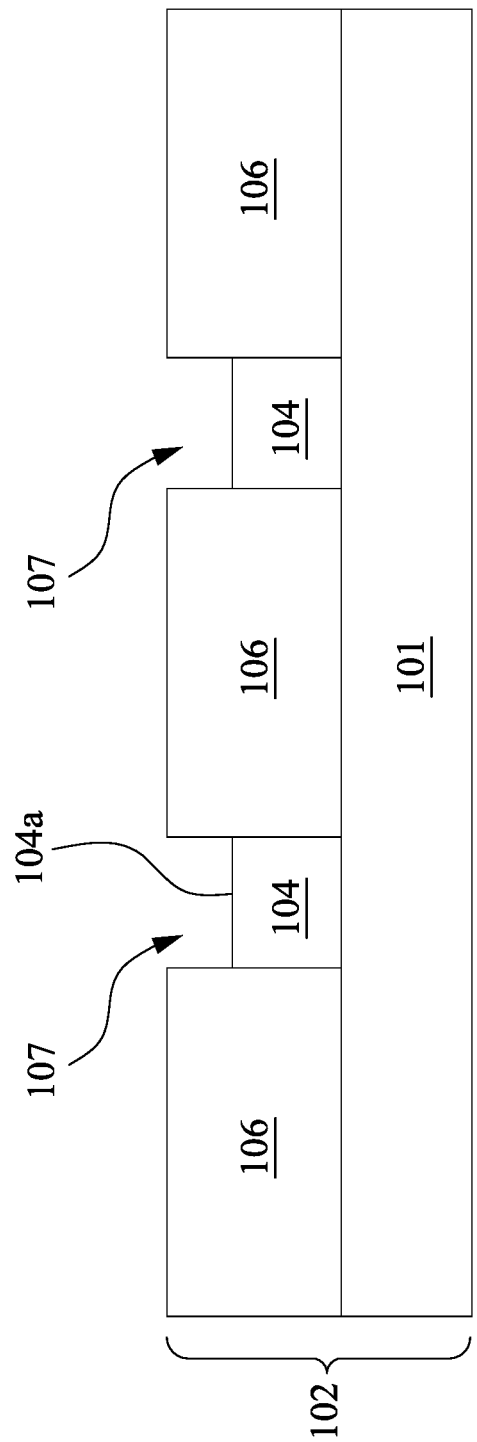
Figure 7:
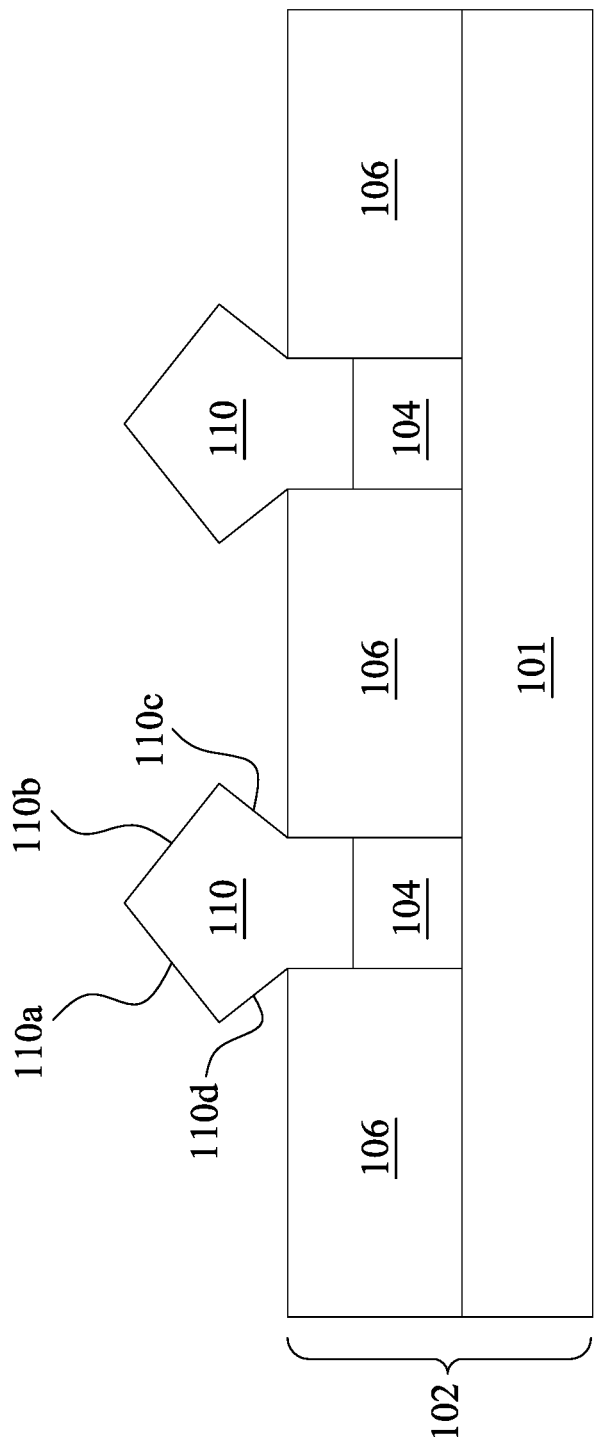

The semiconductor feature 110 may be fabricated by a variety of approaches. FIG. 5-7 are cross-sectional views schematically illustrating methods of forming the semiconductor feature 110 according to some embodiments of the present disclosure.

With reference to FIG. 5, a semiconductor substrate 102 is received, in which the semiconductor substrate 102 has one or more fin portions 104 disposed between an isolation feature 106. In some embodiments, the fin portion(s) 104 may include a portion of the semiconductor substrate 101. In order to form fin portion(s) 104, the semiconductor substrate 101 may be etched to form a number of trenches using suitable processes such as for example typical lithography processes and/or double patterning lithography (DPL) processes. Illustrative examples of the etching process include medium-density plasma etching techniques or high-density plasma etching techniques utilizing inductive, helicon, or electron cyclotron resonance (ECR) plasmas, and/or other suitable etching techniques such as for example reactive ion etching (RIE) processes. The obtained trenches define fin portion 104 and the location of the isolation feature 106. In some examples, the fin portion 104 includes silicon.

The isolation feature 106 may be formed by depositing a dielectric material filling the trenches, and subsequently the excess deposited dielectric material is removed. Illustrated techniques for depositing the dielectric material include, but are not limited to, chemical vapor deposition (CVD) processes, high density plasma (HDP) CVD processes, sub-atmospheric pressure CVD (SACVD) processes, spin-on dielectric (SOD) processes, and other suitable deposition techniques. The dielectric material of the isolation feature 106 may include silicon oxide, silicon nitride, low dielectric constant (low k) materials, or any combination thereof, or the like. Illustrative examples of the low k materials include fluorinated silica glass (FSG), bis-benzocyclobuteues (BCB), carbon doped silicon oxide, amorphous fluorinated carbon, polyimide, and/or other materials. In some examples, the excess deposited dielectric material may be removed by a chemical-mechanical polishing (CMP) process, and/or an etching process. In yet some examples, the isolation feature 106 may be a shallow trench isolation (STI).

With reference to FIG. 6, the fin portion 104 is recessed to form one or more trenches 107 in the isolation feature 106. The recessed fin portion 104 has a top surface 104a within the trench 107. The trench 107 may be formed by a selective wet etching process and/or a selective dry etching process. Illustrative examples of etchants used in the wet etching process include tetramethylammonium hydroxide (TMAH) solution, $HF/CH_3COOH/HNO_3$ solution, or other suitable solutions. Examples of the selective dry etching process include in-situ chemical vapor etching (CVE) techniques, reactive ion etching (RIE) techniques, plasma etching techniques, and/or the like, and/or combinations thereof.

With reference to FIG. 7, a silicon germanium material epitaxially grows from the top surface 104a of the fin portion 104, and continually grows above the trench 107, thereby forming the semiconductor feature 110 including silicon germanium. In some embodiments, the epitaxially grown process may use molecular beam epitaxy (MBE), vapor-phase epitaxy (VPE), ultra-high vacuum CVD (UHV-CVD) or other suitable techniques such as liquid phase epitaxy (LPE). The semiconductor feature 110 has a first facet 110a, a second facet 110b, a third facet 110c and a fourth facet 110d, in which each of the first, second, third and fourth facets 110a, 110b, 110c, 110d has a (111) crystalline orientation. The first and the second facets 110a, 110b constitute a ridge of the semiconductor feature 110. Additionally, the third and fourth facets 110c, 110d adjoin the surface of the isolation feature 106. In some embodiments, each of third and fourth facets 110c, 110d forms an acute angle with the surface of the isolation feature 106. In examples, the acute angle is about 35 degrees to about 70 degrees.

Figure 8:
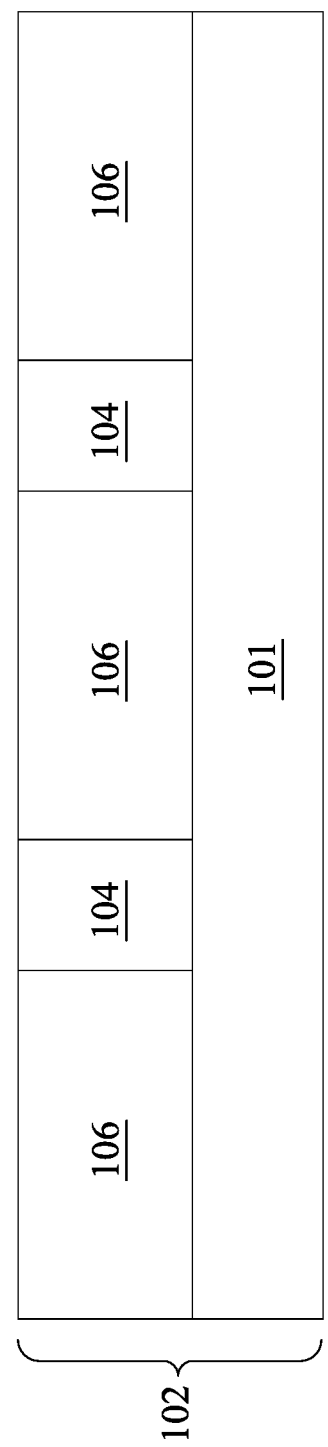
Figure 9:
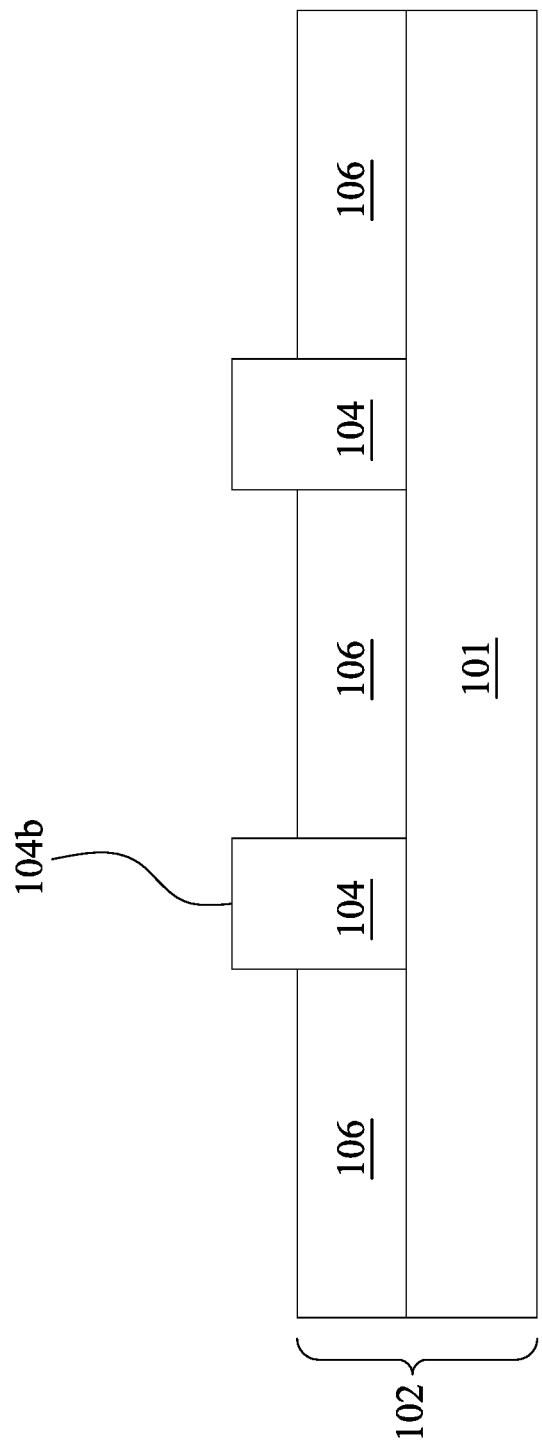
Figure 10:
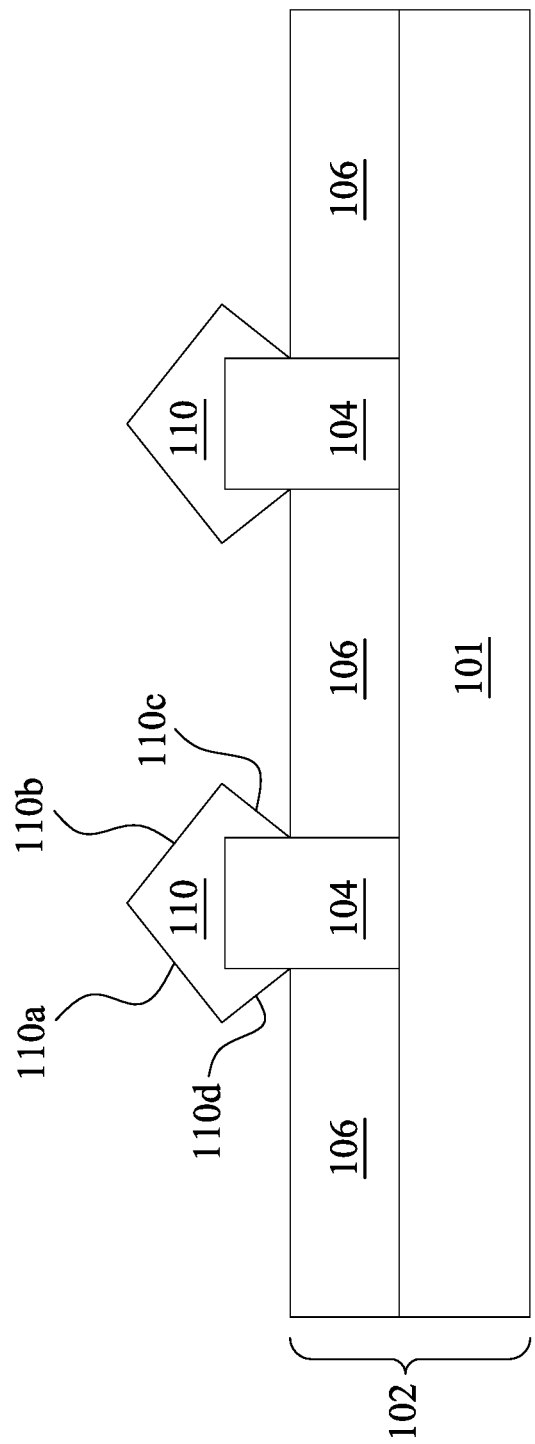

FIG. 8-10 are cross-sectional views schematically illustrating methods of forming the semiconductor feature 110 according to yet some embodiments of the present disclosure.

With reference to FIG. 8, the semiconductor substrate 102 is received. The semiconductor substrate 102 has one or more fin portions 104 disposed between an isolation feature 106. The semiconductor substrate 102 with the fin portion(s) 104 and the isolation feature 106 may be the same as these described above in connection with FIG. 5.

With reference to FIG. 9, a portion of the isolation feature 106 is etched such that a part 104b of the fin portion 104 extends above the isolation feature 106. In specifics, the isolation feature 106 may be etched back in a blanket manner whereas the fin portion 104 is not considerably etched. For example, the etching process may be modulated to render the etching rate of the isolation feature 106 being greater than the etching rate of the fin portion 104. Therefore, the part 104b of the fin portion 104 protrudes out of the surface of the isolation feature 106. In examples, the act of etching back the isolation feature 106 may include a selective wet etching technique using etchants such as for example HF solution, and/or any suitable selective dry etching technique. In some embodiments, the part 104b of the fin portion 104 may have a rectangular-shaped profile with right and left sidewalls, that are perpendicular to a top surface of part 104*b*. The height of the part 104*b* may be controlled by the etching depth of the isolation feature 106.

With reference to FIG. 10, a silicon germanium material is epitaxially grown from the part 104*b* of the fin portion 104, thereby forming the semiconductor feature 110. The formation of the semiconductor feature in FIG. 10 is similar in many respects to the formation of the semiconductor feature in FIG. 7. In FIG. 10, the silicon germanium epitaxally grows over the part 104*b* of the fin portion 104 to form the semiconductor feature 110, and therefore the semiconductor feature 110 includes the fin portion 104 and the silicon germanium grown thereon. The semiconductor feature 110 has four facets 110*a*, 110*b*, 110*c*, and 110*d*, and each has a (111) crystalline orientation. The contour of the semiconductor feature 110 in FIG. 10 may be controlled by the dimension of the part 104*b* of the fin portion 104, and the epitaxially growth conditions such as for example growth rate and growth time. In some embodiments, the epitaxially grown process may use molecular beam epitaxy (MBE), vapor-phase epitaxy (VPE), ultra-high vacuum CVD (UHV-CVD) or other suitable techniques such as liquid phase epitaxy (LPE).

Turning now to FIG. 1, in the operation 14, a gate structure is formed over a portion of the semiconductor feature. As illustrated in FIGS. 2-4, a gate structure 120 is formed traversing the semiconductor feature 110 over the substrate 102, and hence separates the semiconductor feature 110 into a first portion 111 and a second portion 112. The first and second portions 111, 112 of the semiconductor feature 110 define a channel portion 113 between the first and second portions 111, 112. The gate structure 120 is formed crossing over the channel portion 113. In some embodiments, the gate structure may include several features such as for example electrode layers, spacers, dielectric layers, diffusion/barrier layers, interfacial layers, capping layers, other suitable layers, and/or combinations thereof. For example, the gate structure may have a gate dielectric 122 and a gate electrode 124 over the gate dielectric 122. The gate dielectric 122 may include a dielectric material such as for example high-k dielectric material, silicon oxide, silicon nitride, other suitable dielectric material, and/or combinations thereof. Examples of the high-k dielectric material include HfO2, HfTaO, HfTiO, HfSiO, HfSiON, HfZrO, aluminum oxide, other suitable high-k dielectric materials, and/or combinations thereof. The gate electrode 124 may include any suitable material such as for example polysilicon, copper, aluminum, tantalum, titanium, tungsten, cobalt silicide, nickel silicide, TiN, TaN, TiAl, TiAlN, TaCN, TaC, TaSiN, metal alloys, other suitable materials, and/or combinations thereof.

The gate structure 120 may formed by any suitable process. For example, the gate structure 120 may be fabricated by a procedure sequence of deposition processes, photolithographic processes, and etching processes. Illustrative examples of the deposition processes include chemical vapor deposition (CVD) techniques, high density plasma CVD (HDPCVD) techniques, metal organic CVD (MOCVD) techniques, remote plasma CVD (RPCVD) techniques, plasma enhanced CVD (PECVD) techniques, low-pressure CVD (LPCVD) techniques, atomic layer CVD (ALCVD), atmospheric pressure CVD (APCVD) techniques, physical vapor deposition (PVD) techniques, atomic layer deposition (ALD) techniques, plating techniques, other suitable methods, and/or combinations thereof. In addition, the photolithographic processes may include photoresist coating (e.g., spin coating), soft baking, exposure, post-baking, developing the photoresist, drying, other suitable processes, and/or combinations thereof. Examples of the etching process include wet etching processes and/or dry etching processes such as chemical vapor etching (CVE) techniques, reactive ion etching (RIE) techniques, plasma etching techniques, and/or the like.

The gate structure 120 may be a dummy gate stack including a gate dielectric 122, a dummy gate 124" over the gate dielectric 122, and a hard mask 128 over the dummy gate 124", in accordance with some embodiments of the present disclosure. The dummy gate stack may be replaced later by a metal gate and a high-k dielectric in the subsequent gate-replacement processes. The dummy gate stack may be formed by any suitable process. For example, a procedure including deposition, photolithography patterning, and etching processes may be employed to form the dummy gate stack. The gate dielectric 122 may include silicon nitride, silicon oxide, silicon oxynitride, or any other suitable materials. The dummy gate 124" may include polycrystalline silicon or the like. In addition, the hard mask 128 includes any suitable material, for example, silicon nitride, silicon oxynitride and silicon carbide.

Sidewall spacers 126 may be formed on each side of the gate structure 120, as illustrated in FIG. 2. In examples, the sidewall spacers 126 may include one or more dielectrics such as for example silicon oxide, silicon nitride, silicon carbide, silicon oxynitride, or the like, and/or combinations thereof. The spacers 126 may be formed by any suitable process. Illustrative examples of forming the sidewall spacers include operations of depositing one or more dielectric materials over the gate structure 120, and anisotropically etching the dielectric material(s).

In the operation 16 of FIG. 1, a portion of the semiconductor feature is removed such that an interior portion of the semiconductor feature is exposed. As illustrate in FIG. 11, the semiconductor feature 110 may be partially removed such that an interior portion 114 of the semiconductor feature 110 is exposed. For example, the exposed interior portion 114 may include a SiGe surface 116 of the channel portion 113. In some embodiments, the first and second portions 111, 112 of the semiconductor feature 110 are completely removed, thereby exposing the SiGe surface 116 of the channel portion 113. Furthermore, one or more trenches 118 may be formed within the isolation feature 106 of the semiconductor substrate 102 after the first and second portions 111, 112 of the semiconductor feature 110 are removed. The etching process may be a dry etching process, a wet etching process, or a combination thereof. In examples, the etching process may use a mixture of HBr, $Cl_2$, and $O_2$. Alternatively, other etchant mixtures may be used to effectively remove the first and second portions 111, 112. Nevertheless, in yet some embodiments, the first and second portions 111, 112 of the semiconductor feature 110 may be partially etched, leaving remained parts 117 of the first and second portions 111, 112 in the trenches 118 of the isolation feature 106.

Figure 11:
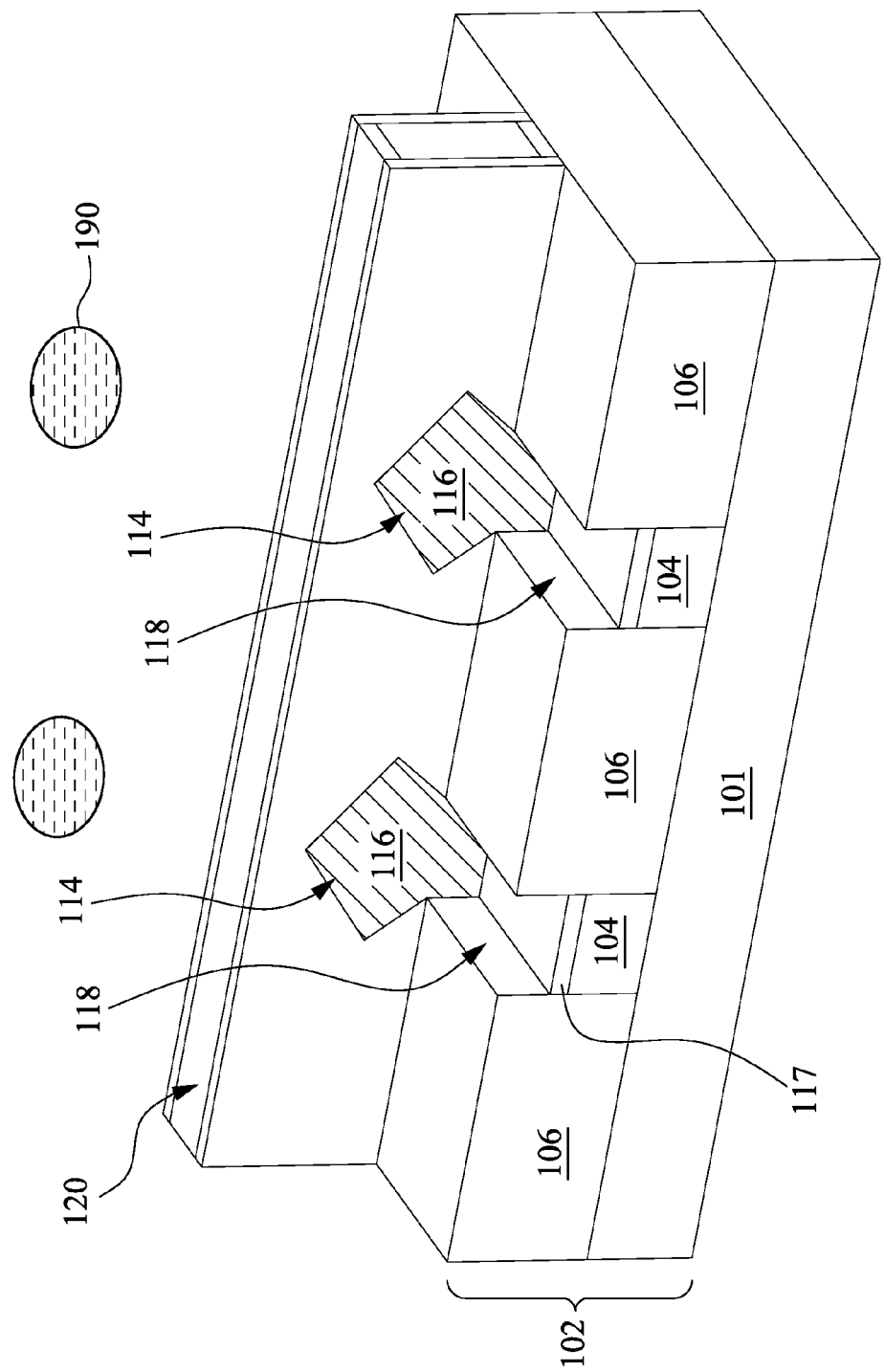

In the operation 18 of FIG. 1, a surface of the exposed interior portion of the semiconductor feature is exposed to a surrounding containing oxygen, thereby forming germanium oxide on the surface of the exposed interior portion. As shown in FIG. 11, the exposed interior portion 114 containing germanium is exposed to and reacted with oxygen, and germanium oxide is formed on the exposed interior portion 114. In some embodiments, the exposed interior portion 114 may include the SiGe surface 116 of the channel portion 113, and oxygen reacts with the germanium component of the SiGe surface 116 so that germanium oxide is formed on the SiGe surface 116. In some embodiments, the molar concentration of oxygen in the surrounding is ranged from approximately 20% to approximately 22%. For example, the surrounding containing oxygen may be air. In yet some embodiments, the thickness of the germanium oxide is approximately 1 angstrom to approximately 100 angstroms, specifically approximately 1 angstrom to approximately 50 angstroms, more specifically approximately 5 angstrom to approximately 30 angstroms.

In the manufacture of semiconductor devices, the exposed germanium material is inevitably exposed to air, which contains oxygen. The exposed germanium material reacts with oxygen in the air, and thereby forming germanium oxide. In various aspects, the formed germanium oxide unfavorably degrades the quality of material deposited thereon in the subsequent processes. For example, when germanium oxide is formed on the exposed SiGe surface 116, it is observed that other materials are difficult to be epitaxially grown on the SiGe surface 116 with germanium oxide. In specifics, the epitaxially grown material on the germanium oxide surface has a porous structure, and exhibits degraded characteristics.

In the operation 20 of FIG. 1, the germanium oxide on the exposed surface of the interior portion is treated with a liquid including water such that the germanium oxide is dissolved in water. For example, as depicted in FIG. 11, liquid water 190 may be provide to contact the germanium oxide on the structure, and therefore dissolves the germanium oxide. In some embodiments, the exposed surface (e.g., SiGe surface 116) of the interior portion 114 may be immersed in deionized water for a sufficient time period to dissolve the germanium oxide thereon. In examples, the SiGe surface 116 having germanium oxide thereon is immersed in deionized water at a temperature of about 20° C. to about 100° C. for a time period of about 5 seconds to about 30 minutes. For example, the temperature of the deionized water for processing the SiGe surface 116 may be about 25° C., 30° C., 40° C., 50° C., 60° C., 70° C., 80° C., or 90° C. In addition, the time period of immersing the SiGe surface 116 in the deionized water may be approximately 10 seconds, 20 seconds, 30 seconds, 50 seconds, 1 minute, 5 minutes, 10 minutes or 20 minutes. In yet some embodiments, deionized water may be supplied or sprayed onto a semiconductor substrate with germanium oxide thereon. The supplied or sprayed deionized water forms a water film flowing over the germanium oxide surface, and therefore dissolves and removes the germanium oxide. In yet some embodiments, the deionized water may include fluorine-containing surfactant to enhance the ability of removing germanium oxide.

The operation 20 may be carried out in an oxygen-free chamber according to some embodiments of the present disclosure. For example, the semiconductor structure with germanium oxide to be processed may be transferred into a chamber full of inert gas such as for example nitrogen gas, argon gas, carbon dioxide gas, or the like, or combinations thereof. Thereafter, deionized water is supplied into the oxygen-free chamber to dissolve the germanium oxide on the semiconductor structure. The germanium oxide is dissolved and removed in the oxygen-free chamber, thereby preventing the semiconductor structure from regeneration of germanium oxide. After the operation 20, a drying process may be carried out to remove water remained on the semiconductor structure. For examples, a vacuum dry process may be carried out in-situ in the oxygen-free chamber.

It is noted that the present disclosure is not limited on processing SiGe surface, and any semiconductor feature including germanium on the surface thereof may be removed by the method of the embodiments of the present disclosure. For example, the embodiments disclosed herein may be applied to remove germanium oxide formed on a feature made of germanium compound, germanium alloy, pure germanium, and/or combinations thereof.

In a comparative example, a SiCoNi™ etching process was used to remove the germanium oxide formed on the semiconductor structure. In order to remove the germanium oxide effectively, the SiCoNi™ chamber had to be operated at a relatively high temperature and under a relatively high pressure. As a result, the RF ignition of the SiCoNi™ chamber continued to experience failures with unacceptable frequency in use. As compared with SiCoNi™ techniques, the embodiments of the present disclosure provide a number of advantages including high throughout, cost effective operations, nontoxic characteristics, saving thermal budget, and damage-free to other features such as shallow trench isolation liners and gate spacers.

Figure 12:
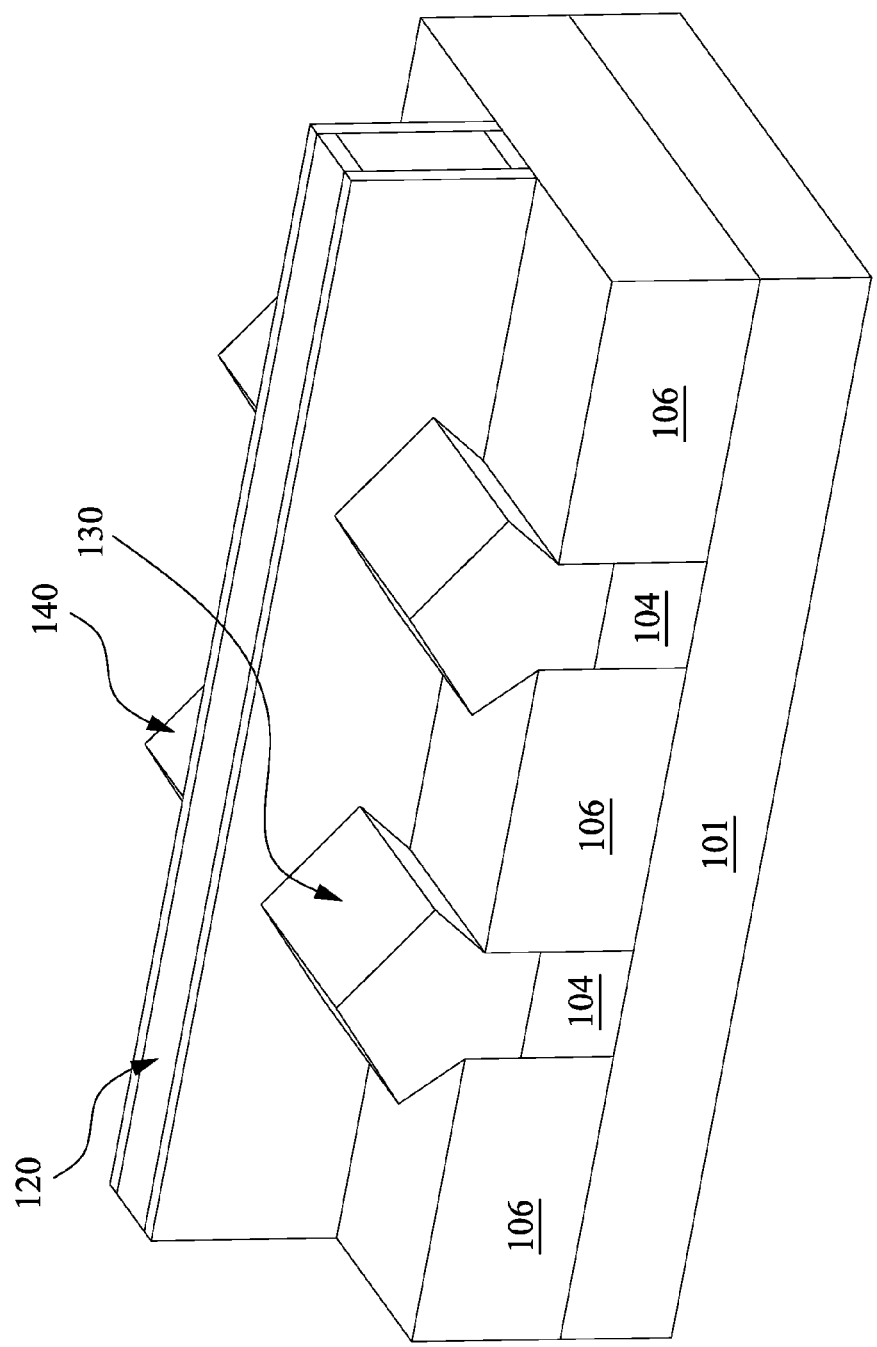

In the operation 22 of FIG. 1, a source structure and a drain structure are formed. In some embodiments, as illustrated in FIG. 12, the source structure 130 and drain structure 140 may be formed on opposite sides of the channel portion 113. For example, a semiconductor material may be epitaxially grown on the fin portion 104 and/or the remained part 117 (if remained part 117 formed) in the trench 118. Because the germanium oxide on the SiGe surface is effective removed, the grown semiconductor material can fill the trench 118, and continually grows above the trench 118, thereby forming the source and drain structures 130, 140 with excellent quality. The source and drain structures 130, 140 respectively adjoin opposite sites of the channel portion 113. In some embodiments, the source structure 130 and the drain structure 140 include silicon germanium formed by a silicon germanium epitaxial deposition process. Illustrative examples of epitaxial deposition processes include molecular beam epitaxy (MBE), vapor-phase epitaxy (VPE), ultrahigh vacuum CVD (UHV-CVD)) or other suitable techniques such as liquid phase epitaxy (LPE). A masking layer may be formed over the substrate to define areas of the semiconductor structure (e.g., finFET) where the semiconductor material may grow during the epitaxial deposition process. The source and drain structures 130, 140 may be doped during epitaxial deposition (epitaxial growth) by adding impurities to the precursor materials of the epitaxy process, or alternatively subsequent to the epitaxial process by an ion implantation process. The doping species may depend on the type of device being manufactured such as an N-type or a P-type device. The doping species include p-type dopants such as for example boron or BF2; n-type dopants such as for example phosphorus or arsenic; or combinations thereof. Annealing processes may be performed to activate the source and drain structures 130, 140. The annealing processes may be rapid thermal annealing (RTA) processes, laser annealing processes, or other suitable annealing processes, for example. In yet some embodiments, the Ge molar concentration of the source and drain structures 130, 140 is greater than that of the channel portion 113. Further, before or after forming the source and drain structures 130, 140, implantation, diffusion, and/or annealing processes may be performed to form desirable features.

After the operation 22, the method 10 may further include other operations or processes. In some embodiments, a silicidation process may be carried out to form one or more silicide features on the source and drain structures 130, 140. In silicidation, a metal layer may be deposited on surfaces of the epitaxy structures and followed by an annealing process. The underlying epitaxy structures may react with the metal layer to produce a silicide layer. The silicided regions have lower resistance than non-silicided regions, and hence improve conductivity. In yet some embodiments, an interlayer dielectric (ILD) layer may be deposited covering the gate structure 120, and the source and drain structures 130, 140 on the substrate 102, and then a chemical mechanical polishing (CMP) process may be performed to planarize certain features. The ILD layer may be formed of a low dielectric constant (low-k) dielectric material, such as phosphosilicate glass (PSG), borophosphosilicate glass (BPSG), fluorinated silicate glass (FSG), silicon carbon material, composites thereof, combinations thereof, or the like. Thereafter, various vias, contacts and/or lines and multilayer interconnect structure such as metal layers and dielectric layers may be formed over the substrate 102, configured to connect with various structures or features of the finFET. The additional features may provide electrical interconnection to the finFET including the gate structure 120, the source structure 130 and the drain structure 140. In some example, a damascene and/or dual damascene process may be used to form a copper related multilayer interconnection structure.

Advantages of various embodiments of the present disclosure include providing a novel method for forming a semiconductor structure. The method disclosed herein provide a number of advantages including high throughout, cost effective operations, nontoxic characteristics, saving thermal budget, and damage-free to other features such as shallow trench isolation liners and gate spacers.

In accordance with one aspect of some embodiments, a method of forming a semiconductor structure includes the following operations: (i) forming a feature comprising germanium over a substrate; (ii) removing a portion of the feature such that an interior portion of the feature is exposed; (iii) exposing a surface of the exposed interior portion to a surrounding containing oxygen; and (iv) treating the surface of the exposed interior portion with a liquid containing water.

In accordance with another aspect of some embodiments, a method of forming a finFET structure includes the following operations: (i) forming a semiconductor feature comprising silicon germanium (SiGe) over a semiconductor substrate; (ii) forming a gate structure over a portion of the semiconductor feature, such that the gate structure traverses the semiconductor feature, thereby separating a first portion and a second portion of the semiconductor feature, wherein the first and second portions of the semiconductor feature define a channel portion there between; (iii) removing the first and second portions of the semiconductor feature to expose a SiGe surface of the channel portion; (iv) treating the SiGe surface with a liquid containing water; and (v) forming a source structure and a drain structure on opposite sides of the channel portion.

In accordance with another aspect of some embodiments, a method of forming a finFET structure includes the following operations: (i) epitaxially growing a material comprising germanium to form a fin structure having a first facet and a second facet, in which the first and the second facets constitute a ridge of the fin structure, and each of the first and second facets has a (111) crystalline orientation; (ii) forming a gate crossing over the first and the second facets of fin structure, in which the fin structure comprises a first portion and a second portion exposed out of the gate, and a channel portion under the gate; (iii) removing the first and second portions of the fin structure such that a surface comprising germanium of the channel portion is exposed; (iv) treating the exposed surface comprising germanium of the channel portion with a liquid containing water; (v) forming a source and a drain on opposite sides of the channel portion after treating the exposed surface comprising germanium of the channel portion with the liquid containing water.

What is claimed is:

1. A method, comprising:
   forming a fin structure comprising germanium protruding from a substrate, wherein the fin structure has a channel portion and a first portion and a second portion at opposite sides of the channel portion;
   forming a gate structure crossing over the channel portion;
   removing the first and second portions comprising germanium of the fin structure such that a side surface comprising germanium of the channel portion is exposed;
   exposing the side surface comprising germanium of the channel portion to a surrounding containing oxygen to form a germanium oxide layer on the side surface comprising germanium of the channel portion;
   treating the germanium oxide layer on the side surface comprising germanium of the channel portion with a liquid consisting essentially of water to remove the germanium oxide layer to form a germanium-containing side surface; and
   forming a silicon germanium source/drain structure on the germanium-containing side surface treated with the liquid consisting essentially of water.

2. The method according to claim 1, wherein treating the germanium oxide layer on the side surface comprising germanium of the channel portion with the liquid consisting essentially of water comprises dissolving the germanium oxide layer.

3. The method according to claim 1, wherein the fin structure is made of silicon germanium.

4. The method according to claim 1, wherein the molar concentration of oxygen in the surrounding ranges from approximately 20% to approximately 22%.

5. The method according to claim 1, wherein treating the germanium oxide layer on the side surface comprising germanium of the channel portion with the liquid consisting essentially of water comprises immersing the germanium oxide layer into deionized water.

6. A method of forming a finFET structure, comprising:
   forming a fin structure comprising silicon germanium (SiGe) over a semiconductor substrate;
   forming a gate structure over a portion of the fin structure, such that the gate structure traverses the fin structure, thereby separating a first portion and a second portion of the fin structure, wherein the first and second portions of the fin structure define a channel portion there between;
   removing the first and second portions comprising SiGe of the fin structure to expose a SiGe side surface of the channel portion;
   forming germanium oxide on the channel portion by reacting the SiGe side surface with oxygen;
   applying a liquid consisting essentially of water to dissolve the germanium oxide on the channel portion to form a SiGe side surface of the channel portion; and
   forming a source/drain structure comprising SiGe on the SiGe side surface formed by the applying the liquid consisting essentially of water.

7. The method according to claim 6, wherein applying the liquid consisting essentially of water comprises allowing the SiGe side surface to be in contact with deionized water.

8. The method according to claim 6, wherein applying the liquid consisting essentially of water comprises immersing the germanium oxide on the channel portion into deionized water at a temperature of about 20° C. to about 100° C. for a time period of about 10 seconds to about 10 minutes.

9. The method according to claim 6, wherein forming the fin structure comprises:
receiving the semiconductor substrate, wherein the semiconductor substrate has a fin portion disposed between an isolation feature;
recessing the fin portion to form a trench in the isolation feature, wherein the recessed fin portion has a top surface within the trench; and
epitaxially growing silicon germanium from the top surface of the fin portion, thereby forming the fin structure.

10. The method according to claim 6, wherein forming the fin structure comprises:
receiving the semiconductor substrate, wherein the semiconductor substrate has a fin portion disposed between an isolation feature;
etching away a portion of the isolation feature such that a part of the fin portion extends above the isolation feature; and
epitaxially growing silicon germanium from the part of the fin portion that extends above the isolation feature, thereby forming the fin structure.

11. The method according to claim 10, wherein the fin portion comprises silicon.

12. The method according to claim 6, wherein the molar concentration of germanium in the fin structure ranges from approximately 20% to approximately 80%.

13. The method according to claim 6, wherein removing the first and second portions comprising SiGe of the fin structure comprises completely etching away the first and second portions of the fin structure.

14. The method according to claim 6, wherein removing the first and second portions comprising SiGe of the fin structure comprises partially etching the first and second portions of the fin structure, thereby leaving parts of the first and second portions on the semiconductor substrate.

15. The method according to claim 6, wherein removing the first and second portions of the fin structure comprises forming a trench in the semiconductor substrate.

16. The method according to claim 15, wherein forming the source/drain structure comprising SiGe comprises epitaxially growing silicon germanium from the trench in the semiconductor substrate.

17. The method according to claim 16, wherein the molar concentration of germanium in the source/drain structure is greater than that in the channel portion.

18. A method of forming a finFET structure, comprising:
epitaxially growing a material comprising germanium to form a fin structure having a first facet and a second facet, wherein the first and the second facets constitute a ridge of the fin structure, and each of the first and second facets has a (111) crystalline orientation;
forming a gate crossing over the first and the second facets of the fin structure, wherein the fin structure comprises a first portion and a second portion exposed out of the gate, and a channel portion under the gate;
removing the first and second portions of the fin structure such that a side surface comprising germanium of the channel portion is exposed;
forming germanium oxide on the channel portion by reacting oxygen with the side surface comprising germanium;
applying a liquid consisting essentially of water to dissolve the germanium oxide on the side surface comprising germanium of the channel portion to form a germanium-containing side surface of the channel portion; and
forming a source/drain comprising silicon germanium on the germanium-containing side surface formed by the applying the liquid consisting essentially of water.

19. The method according to claim 18, wherein the fin structure further comprises a third facet and a fourth facet, and each of the third and fourth facets has a (111) crystalline orientation.

20. The method according to claim 19, wherein the material comprising germanium comprises silicon germanium, and the germanium-containing side surface comprises silicon germanium.

* * * * *